United States Patent
Kim et al.

(10) Patent No.: US 6,867,804 B1
(45) Date of Patent: Mar. 15, 2005

(54) IMAGE SENSOR FOR IMPLEMENTING DATA READ OPERATION AT HIGH SPEED

(75) Inventors: Chan-Ki Kim, Ichon-shi (KR); Kang-Jin Lee, Ichon-shi (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 852 days.

(21) Appl. No.: 09/698,473

(22) Filed: Oct. 30, 2000

(30) Foreign Application Priority Data

Oct. 30, 1999 (KR) .......................................... 1999-47729

(51) Int. Cl.[7] .......................... H04N 3/14; H04N 5/335; H03M 1/12
(52) U.S. Cl. ........................ 348/294; 348/302; 341/155
(58) Field of Search ................................ 348/294, 302, 348/308; 341/155, 169, 172; 326/95, 98; 365/203

(56) References Cited

U.S. PATENT DOCUMENTS

| | | | | |
|---|---|---|---|---|
| 5,345,266 A | * | 9/1994 | Denyer ........................ 348/300 |
| 5,508,640 A | * | 4/1996 | Partovi et al. ................ 326/98 |
| 5,671,181 A | * | 9/1997 | Hatsuda ................... 365/189.05 |
| 5,815,107 A | * | 9/1998 | Frankeny et al. ........... 341/159 |
| 5,877,715 A | * | 3/1999 | Gowda et al. ............... 341/122 |
| 6,115,066 A | * | 9/2000 | Gowda et al. ............... 348/308 |
| 6,229,133 B1 | * | 5/2001 | Hynecek ................... 250/208.1 |
| 6,580,454 B1 | * | 6/2003 | Perner et al. ............... 348/302 |
| 2001/0017344 A1 | * | 8/2001 | Aebi ..................... 250/214 VT |
| 2002/0085105 A1 | * | 7/2002 | Sohn .......................... 348/294 |

* cited by examiner

Primary Examiner—Wendy R. Garber
Assistant Examiner—Kelly L. Jerabek
(74) Attorney, Agent, or Firm—Pillsbury Winthrop LLP (57) ABSTRACT

An image sensor is an apparatus for sensing a light beam to generate a digital image data. The image sensor includes a pixel array for sensing a light beam to generate an analog image data, a control and interface unit for managing an interface with external circuits and generating control signals, a decoding unit for decoding the column address signal to generate a column selection signal, and a conversion unit for converting the analog image data into a digital image data. The conversion unit includes a ramp voltage generation circuit for generating a ramp voltage signal, a comparison circuit for comparing a voltage level of the ramp voltage signal with that of the analog image data to generate a latch enable signal, a storage circuit for storing the digital count signal in response to the latch enable signal and outputting stored digital count signal to a bit line in response to the control signals, and an acceleration circuit for detecting a voltage variation of the bit line to accelerate the voltage variation of the bit line.

14 Claims, 6 Drawing Sheets

IMAGE SENSOR FOR IMPLEMENTING DATA READ OPERATION AT HIGH SPEED

FIELD OF THE INVENTION

The present invention relates to an image processing device; and, more particularly, to an image sensor having an acceleration circuit for detecting a voltage variation of a bit line and accelerating the voltage variation, thereby implementing a data read operation at a high speed.

DESCRIPTION OF THE PRIOR ART

As is well known, an image sensor provided with an array of M×N light detecting elements is used for converting an image impinged thereon into electrical signals. When an image is incident to the array, each of the light detecting elements produces an electrical signal corresponding to an intensity of light focused thereon. And then, the electrical signal is converted into a digital signal to display a corresponding image on an optical device such as a monitor.

Although a charged-coupled device (CCD) imager has been played an important role as an image sensor, it requires various support chips to operate the CCD imager, perform post processing and generate the standard digital signal, which, in turn, makes the system of CCD imager complicated an requires numerous power supplies, clock drivers and voltage regulator which consume significant amount of power.

Recently, a complementary metal oxide semiconductor (CMOS) imager has been introduced to overcome the above-described shortcomings.

Figure 1:
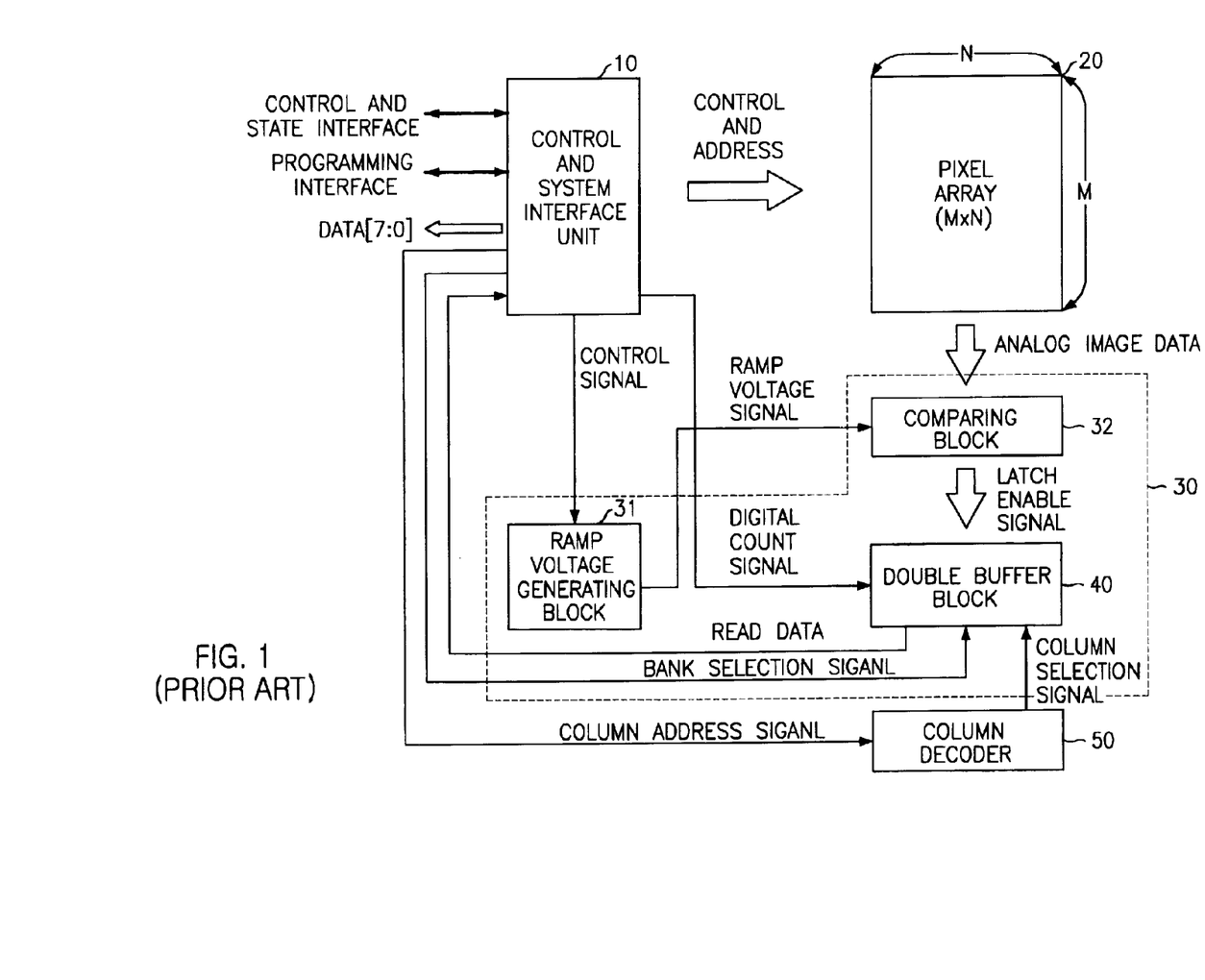
FIG. 1 is a block diagram showing a conventional image sensor.

In FIG. 1, there is illustrated one of prior art CMOS imagers including a control and system interface unit 10, a pixel array 20, an analog-to-digital conversion unit 30 and a column decoder 50. The analog-to-digital conversion unit 30 includes a ramp voltage generating block 31, a comparing block 32, and a double buffer block 40.

The pixel array 20 senses a light beam to generate an analog image data and the ramp voltage generating block 31 generates a ramp voltage signal. The comparing block 32 compares the analog image data with the ramp voltage signal to generate a latch enable signal. At this time, the control and system interface unit 10 counts the number of clocks to generate a digital count signal during the comparison operation.

The double buffer block 40 stores the digital count signal in response to the latch enable signal.

Figure 2:
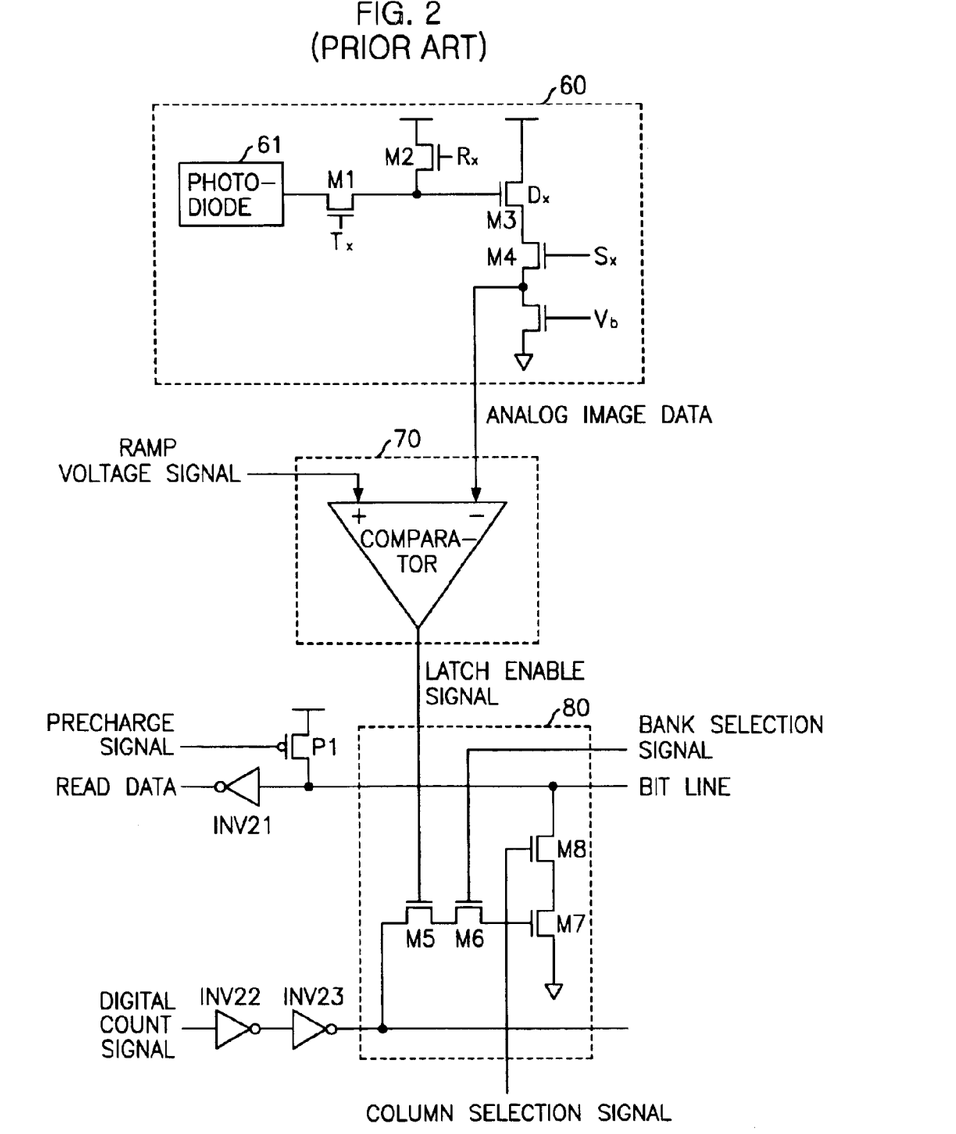
FIG. 2 is a circuit diagram showing a conventional image sensor core.

FIG. 2 is a circuit diagram showing a conventional image sensor core.

Referring to FIG. 2, an image sensor core includes a unit pixel 60, a comparator 70 and a unit latch circuit 80. The unit pixel 60 includes a photodiode 62 for sensing a light beam impinged thereon to generate photoelectric charges and four transistors M1, M2, M3 and M4 for outputting an analog image data corresponding to the generated photoelectric charges. The unit latch circuit 80 includes a first to a fourth NMOS transistors M5 to M8.

First, an operation of converting the analog image data into the digital image data will be described with reference to FIGS. 1 and 2.

The unit pixel 60 generates an analog image data having a predetermined voltage level, and a ramp voltage generator contained in the ramp voltage generating block 31 generates a ramp voltage signal in response to a control signal outputted from the control and system interface unit 10. The comparator 70 compares the ramp voltage signal with the analog image data.

As a result of comparison, while the voltage level of the ramp voltage signal is greater than that of the analog image data, the comparator 70 activates the latch enable signal to a high level. Meanwhile, the control and interface unit 10 performs an operation of up-counting the number of the clocks and generates a count signal to the unit latch circuit 80.

In the unit latch circuit 80, a first NMOS transistor M5 and a second NMOS transistor M6 are turned on/off in response to the latch enable signal and the bank selection signal, respectively. Accordingly, if the latch enable signal and the bank selection signal are activated, the first NMOS transistor M5 and the second NMOS transistor M6 are turned on so that the count signal is applied, or stored, to a gate of a third NMOS transistor M7.

On the contrary, if the latch enable signal is inactivated, the first NMOS transistor M5 is turned off so that the count signal cannot be stored in the unit latch circuit 80 any longer. At this time, a finally stored count signal corresponds to the digital image data.

Second, a data read operation of the CMOS imager will be described.

When the first, the second, and the fourth NMOS transistors M5, M6 and M8 are in turned-off states and the clock is in a state of a low level, a PMOS transistor P1 is turned on in response to a precharge signal so that a bit line becomes a high level. As a result, a high level signal is passed through an inverter INV21 so that a read data of a low level is outputted.

When the clock is in a state of high level, the PMOS transistor P1 is turned off. At this time, if a voltage on the gate of the third transistor M7 is a low level, the bit line maintains a high level so that the read data of the low level is outputted.

On the contrary, if a voltage on the gate of the third transistor M7 is a high level, the bit line becomes a low level so that the read data of a high level is outputted. By repeating the above-described procedures, the digital image data stored in the unit latch circuit 80 is outputted.

At this time, the column detection signal, which is used to turn on/off the fourth NMOS transistor M8, is obtained by decoding the column address signal. However, it takes long time for the column selection signal to change from a low level to a high level. Therefore, in case where the digital image data stored in the unit latch circuit 80 is a high level, it also takes long time to change a voltage level of the bit line from a high level to a low level, so that it is difficult to obtain a high speed of operation in a data read operation.

SUMMARY OF THE INVENTION

It is, therefore, an object of the present invention to provide an image sensor having an acceleration circuit for detecting a voltage variation of a bit line and accelerating the voltage variation, thereby implementing a data read operation at a high speed.

In accordance with an aspect of the present invention, there is provided an analog-to-digital converter for use in an image sensor, comprising: a storage means for storing a digital image data and outputting the digital image data to a bit line; and an acceleration means for detecting a voltage variation of the bit line to accelerate the voltage variation of the bit line.

In accordance with another embodiment of the present invention, there is provided an image sensor comprising: a pixel array for sensing a light beam to generate an analog image data; a control and interface means for managing an interface with external circuits and generating control signals, the control signals including a digital count signal, a column address signal, a decoding means for decoding the column address signal to generate a column selection signal; and a bank selection signal; and a conversion means for converting the analog image data into a digital image data, the conversion means including: a ramp voltage generation means for generating a ramp voltage signal whose voltage level is linearly decreased according to a clock; a comparison means for comparing a voltage level of the ramp voltage signal with that of the analog image data to generate a latch enable signal; a storage means for storing the digital count signal in response to the latch enable signal and outputting stored digital count signal to a bit line in response to the column selection signal and the bank selection signal; and an acceleration means for detecting a voltage variation of the bit line to accelerate the voltage variation of the bit line.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 3:
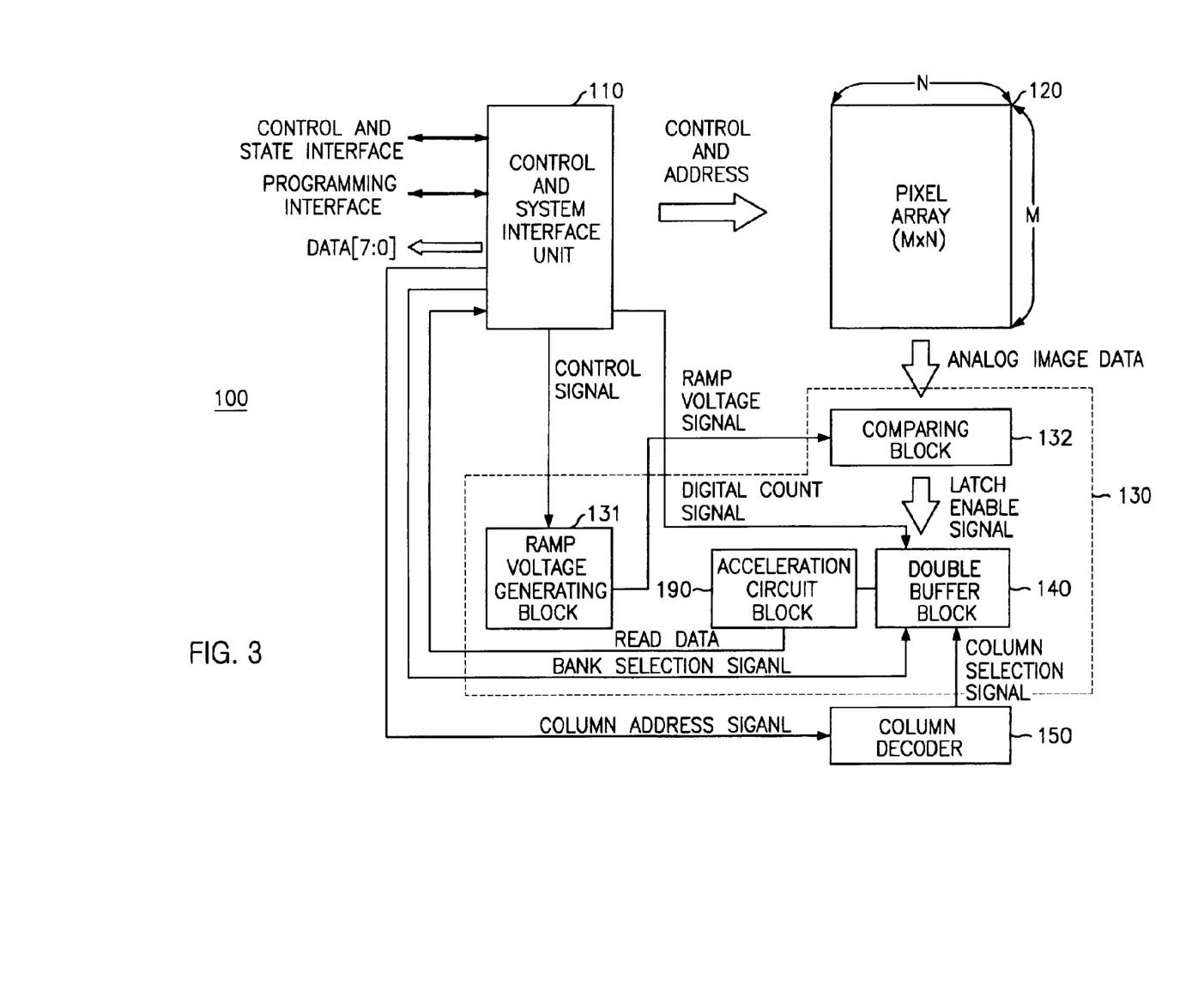
FIG. 3 is a block diagram illustrating an image sensor in accordance with the present invention.

FIG. 3 is a block diagram illustrating an image sensor in accordance with the present invention.

Referring to FIG. 3, an image sensor in accordance with the present invention includes a control and system interface unit 110, a pixel array 120, an analog-to-digital conversion unit 130, and a column decoder 150.

The control and system interface unit 110 manages an interface with external circuits and generates control signals which includes a count signal, a column address signal, a bank selection signal, and the like.

The pixel array 120 contains a plurality of unit pixels for sensing a light beam impinged thereon to generate an analog image data. The unit pixels are generally arranged in a form of M×N matrix, where M and N are positive integers.

The analog-to-digital conversion unit 130 converts the analog image data into a digital image data. The analog-to-digital conversion unit 130 also includes a ramp voltage generating block 131, a comparing block 132, a double buffer block 140, and an acceleration circuit block 190.

The ramp voltage generating block 131 includes a plurality of ramp voltage generators for generating a ramp voltage signal whose voltage level is linearly decreased every clock.

The comparing block 132 includes a plurality of comparators for comparing a voltage level of the reference voltage signal with that of the analog image data to generate a latch enable signal. As this time, the latch enable signal is activated while the voltage level of the ramp voltage signal is higher than that of the analog image data, and the latch enable signal is inactivated when the voltage level of the ramp voltage signal becomes smaller than that of the analog image data.

Meanwhile, the control and system interface unit 110 counts the number of clocks to output a digital count signal while the comparing block 132 performs an operation of comparison.

The double buffer block 140 includes a plurality of unit latch circuits for storing the digital count signal in response to the latch enable signal. The stored digital count signal is outputted to a bit line in response to a column selection signal and a bank selection signal.

The acceleration circuit block 190 includes a plurality of unit acceleration circuits for detecting a voltage variation of the bit line to accelerate the voltage variation of the bit line to a desired level, or a high level or a low level.

The column decoder 150 decodes a column address signal to output a column selection signal to the double buffer block 40.

Figure 4:
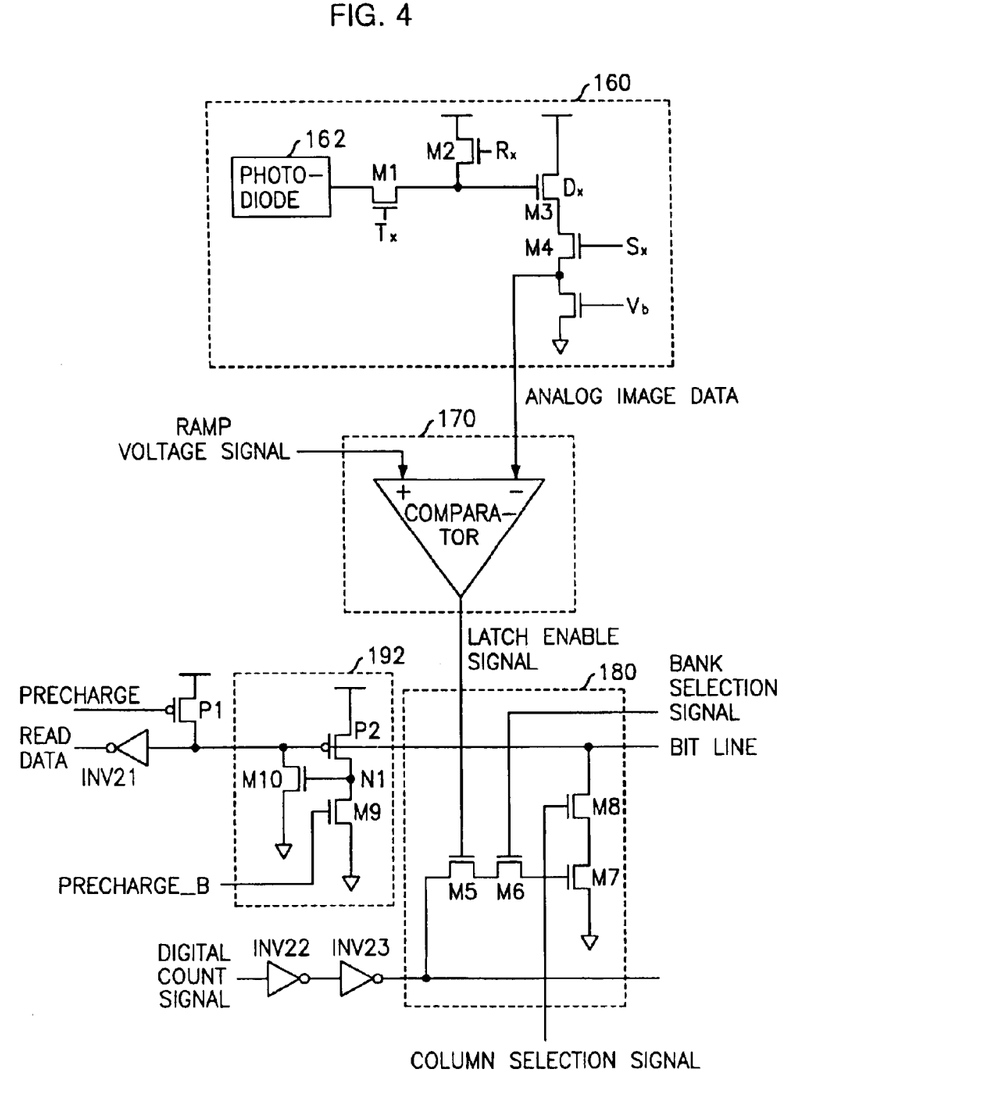
FIG. 4 is a circuit diagram illustrating an image sensor core a unit acceleration circuit in accordance with the present invention.

FIG. 4 is a circuit diagram showing an image sensor core and a unit acceleration circuit in accordance with the present invention.

Referring to FIG. 4, an image sensor core includes a unit pixel 160, a comparator 170, and a unit latch circuit 180. Although the image sensor includes a plurality of image sensor cores, for the sake of convenience, one image sensor core is drawn. For example, for converting the analog image data into 8 bit digital image data, eight unit latch circuits are needed.

The unit pixel 160 includes a photodiode 162 for sensing a light beam impinged thereon to generate photoelectric charges and four transistors M1, M2, M3, and M4 for outputting an analog image data corresponding to the photoelectric charges.

The unit latch circuit 180 includes a first to a fourth NMOS transistors M5 to M8. The first NMOS transistor M5 and the second NMOS transistor M6 are turned on/off in response to the latch enable signal and the bank selection signal, respectively, to thereby transfer the digital count signal. The digital count signal transferred via the first and the second NMOS transistors M5 and M6 is applied to a gate of the third NMOS transistor M7. The fourth NMOS transistor M8 is turned on/off in response to the column selection signal so that the according to the digital count signal is applied to the bit line.

Here, a first PMOS transistor P1 is used to precharge the bit line in response to the precharge signal PRECHARGE.

The unit acceleration circuit 192 includes a second PMOS transistor P2, a fifth NMOS transistor M9, and a sixth NMOS transistor M10.

The second PMOS transistor P2, which has a source coupled to a power voltage line and a gate coupled to the bit line, detects a voltage level of the bit line. The fifth NMOS transistor M9 has a drain coupled to a drain of the second PMOS transistor P2, a source coupled to a ground, and a gate receiving an inverted precharge signal PRECHARGE_B. The sixth NMOS transistor M10 has a drain coupled to the bit line, a source coupled to the ground, and a gate coupled to the node N1.

The fifth NMOS transistor M9 is turned on/off in response to the inverted precharge signal PRECHARGE_B to determine a voltage level of the node N1. The sixth NMOS transistor M10 is turned on/off in response to the voltage level of the node N1.

Figure 5:
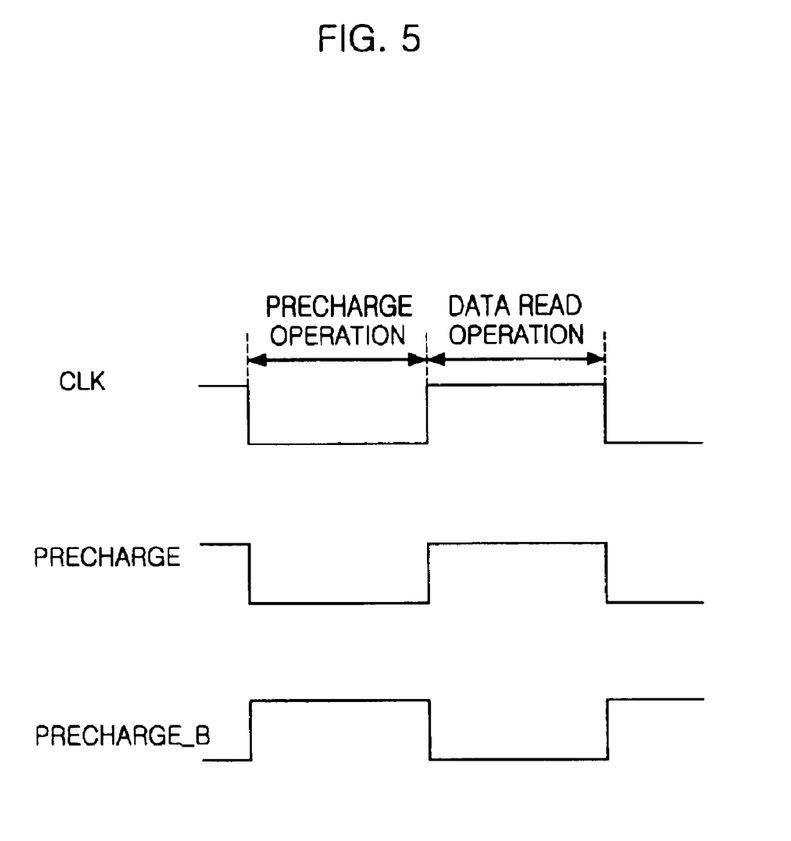
FIG. 5 is a diagram illustrating a waveform of a precharge signal and an inverted precharge signals.

FIG. 5 is a waveform of a precharge signal and an inverted precharge signal according to a clock.

As shown, a precharging operation is carried out when the clock CLK is a low level, and a data read operation is carried out when the clock is a high level. That is, a phase of the clock CLK is equal to that of the precharge signal PRECHARGE.

Hereinafter, an operation of the image sensor core will be described with reference to FIGS. 3 to 5.

First, when the clock CLK is a low level, the precharge signal is a low level so that the first PMOS transistor P1 and the fifth NMOS transistor M9 are turned on. Therefore, the bit line is precharged to a high level and the node N1 becomes a low level, thereby turning off the sixth NMOS transistor M10. Additionally, the second PMOS transistor P2 is turned off in response to the high voltage of the bit line so that there is no influence on a voltage level of the bit line. That is, like the prior art, a read data of a low level is outputted to an exterior.

Second, it is assumed that the digital count signal of a logic zero is stored in the unit latch circuit 180. When the clock CLK is a high level, the precharge signal PRECHARGE becomes a high level so that the first PMOS transistor P1 and the fifth NMOS transistor M9 are turned off. Therefore, the bit line still maintains the high level.

The second PMOS transistor P2 is also turned off in response to the high level of the bit line and the node N1 maintains the low level. As a result, the read data is outputted in a state of the low level. At this time, although the column selection signal is activated, the third NMOS transistor M7 is turned off since the gate of the third NMOS transistor M7 has a low level. Additionally, a current path between the bit line and the ground is not formed, so that there is no problem in a timing control.

Third, it is assumed that the digital count signal of a logic one is stored in the unit latch circuit 180. At an earlier period when the clock is a high level, the first PMOS transistor P1 and the fifth NMOS transistor M9 are turned off in response to the precharge signal of a high level, so that the bit line maintains a high level. The node N1 also maintains the low level so that the sixth NMOS transistor M10 is turned off. Thus, there is no influence on the voltage level of the bit line.

However, when the fourth NMOS transistor M8 is turned on in response to the column selection signal, a current path between the bit line and the ground is formed. That is, charges on the bit line are flowed to the ground via the NMOS transistors M8 and M7. At this time, if the voltage of the bit line becomes less than a threshold voltage of the second PMOS transistor, the second PMOS transistor P2 is turned on, thereby changing a voltage level of the node N1 from the low level to the high level. Thus, the sixth NMOS transistor M10 is turned on so that another current path between the bit line and the ground is formed. As a result, the voltage of the bit line is swiftly changed to the low level. Such a positive feedback operation is stopped when the clock becomes again a low level.

Figure 6A:
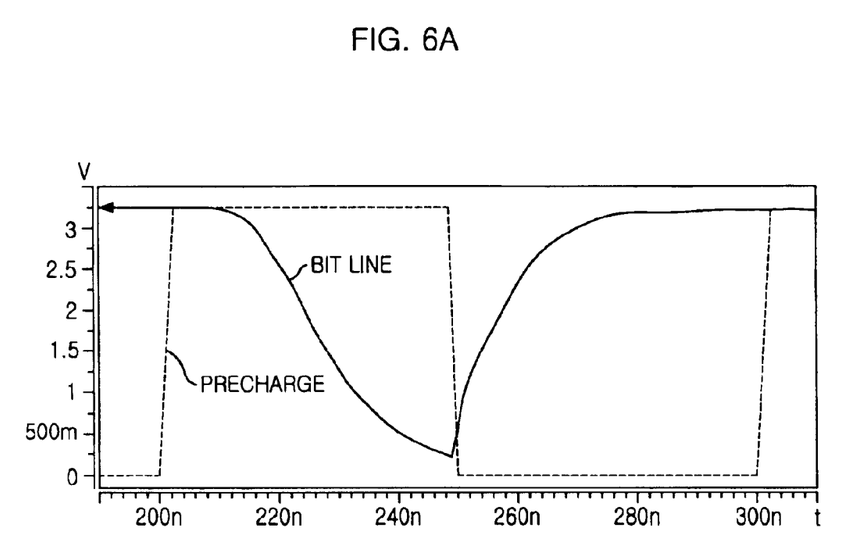
FIGS. 6A and 6B are a simulation result illustrating a waveform of a voltage variation of a bit line according to the prior art and the present invention, respectively.
Figure 6B:
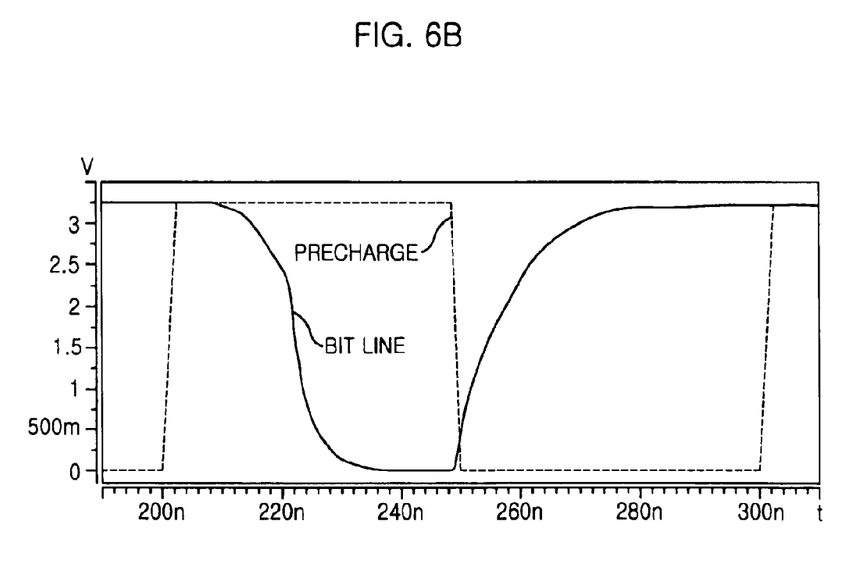

FIGS. 6A and 6B is simulation results illustrating a voltage transition of the bit line with respect to a precharging operation and a data read operation according to the prior art and the present invention, respectively.

As can seen, although there is no difference between the prior art and the present invention during a precharging operation, there is a large difference therebetween during a data read operation. That is, compared with the prior art, the voltage level of the bit line is changed to a low level much faster, thereby implementing a data read operation at a high speed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An analog-to-digital converter for use in an image sensor, comprising:
   a storage means for storing a digital image data and outputting the digital image data to a bit line; and
   an acceleration means for detecting a voltage variation of the bit line to accelerate the voltage variation of the bit line,
   wherein the acceleration means includes
      a first means, coupled to a node, for detecting the voltage variation of the bit line;
      a second means, in response to an inverted precharge signal, for determining a voltage level of the node; and
      a third means, responsive to the voltage level of the node, for electrically coupling the bit line to the ground.

2. The analog-to-digital converter as recited in claim 1, further comprising:
   a precharge means for precharging the bit line in response to a precharge signal.

3. The analog-to-digital converter as recited in claim 1, wherein the first means is a PMOS transistor, which has a source coupled to a power voltage level, a gate coupled to the bit line, and a drain coupled to the node.

4. The analog-to-digital converter as recited in claim 3, wherein the second means is an NMOS transistor, which has a drain coupled to the node, a source coupled to the ground, and a gate receiving the inverted precharge signal.

5. The analog-to-digital converter as recited in claim 4, wherein the third means is an NMOS transistor, which has a drain coupled to the bit line, a source coupled to the ground, and a gate receiving the voltage level of the node.

6. An image sensor comprising:
   a pixel array for sensing light beam to generate an analog image data;
   a control and interface means for managing an interface with external circuits and generating control signals, the control signals including a digital count signal, a column address signal, and a bank selection signal;
   a decoding means for decoding the column address signal to generate a column selection signal; and
   a conversion means for converting the analog image data into a digital image data, the conversion means including
      a ramp voltage generation means for generating a ramp voltage signal whose voltage level is linearly decreased according to a clock;
      a comparison means for comparing a voltage level of the ramp voltage signal with that of the analog image data to generate a latch enable signal;
      a storage means for storing the digital count signal in response to the latch enable signal and the bank selection signal and outputting stored digital count signal to a bit line in response to the column selection signal; and an acceleration means for detecting a voltage variation of the bit line to accelerate the voltage variation of the bit line, the acceleration means including a first means, coupled to a node, for detecting the voltage variation of the bit line;

a second means, in response to an inverted precharge signal, for determining a voltage level of the node; and a third means, responsive to the voltage level of the node, for electrically coupling the bit line to the ground.

7. The image sensor as recited in claim 6, further comprising a precharge means for precharging the bit line in response to a precharge signal.

8. The image sensor as recited in claim 6, wherein the first means is a PMOS transistor, which has a source coupled to a power voltage level, a gate coupled to the bit line, and a drain coupled to the node.

9. The image sensor as recited in claim 8, wherein the second means is an NMOS transistor, which has a drain coupled to the node, a source coupled to the ground, and a gate receiving the inverted precharge signal.

10. The image sensor as recited in claim 9, wherein the third means is an NMOS transistor, which has a drain coupled to the bit line, a source coupled to the ground, and a gate receiving the voltage level of the node.

11. The image sensor as recited in claim 6, wherein the pixel array includes a plurality of unit pixels, arranged in a matrix of M×N, M and N being integers, each unit pixel having a photodiode for sensing the light beam to generate photoelectric charges and four NMOS transistors for outputting the analog image data corresponding to the photoelectric charges.

12. The image sensor as recited in claim 7, wherein the latch enable signal is activated to a high level while the voltage level of the ramp voltage signal is higher than that of the analog image data.

13. The image sensor as recited in claim 12, wherein the storage means includes:

a first NMOS transistor having a drain coupled to the digital count signal and a gate receiving the latch enable signal;

a second NMOS transistor having a drain coupled to a source of the first NMOS transistor and a gate receiving the bank selection signal;

a third NMOS transistor having a source coupled to a ground and a gate receiving the digital count signal transferred via the first and the second NMOS transistors; and a fourth NMOS transistor having a drain coupled to the bit line, a source coupled to a drain of the third NMOS transistor, and a gate receiving the column selection signal.

14. The image sensor as recited in claim 13, wherein a phase of the clock is equal to that of the precharge signal.

* * * * *